(12) United States Patent
Kumura

(10) Patent No.: US 9,818,797 B2
(45) Date of Patent: Nov. 14, 2017

(54) MAGNETIC MEMORY DEVICE AND METHOD OF MANUFACTURING THE SAME

(71) Applicant: TOSHIBA MEMORY CORPORATION, Minato-ku, Tokyo (JP)

(72) Inventor: Yoshinori Kumura, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/068,107

(22) Filed: Mar. 11, 2016

(65) Prior Publication Data

US 2017/0062521 A1    Mar. 2, 2017

Related U.S. Application Data

(60) Provisional application No. 62/212,981, filed on Sep. 1, 2015.

(51) Int. Cl.
| | | |
|---|---|---|
| *H01L 43/02* | (2006.01) | |
| *H01L 27/22* | (2006.01) | |
| *H01L 43/08* | (2006.01) | |
| *G11C 11/16* | (2006.01) | |
| *H01L 43/12* | (2006.01) | |
| *H01L 43/10* | (2006.01) | |

(52) U.S. Cl.
CPC .......... *H01L 27/228* (2013.01); *G11C 11/161* (2013.01); *H01L 43/02* (2013.01); *H01L 43/08* (2013.01); *H01L 43/10* (2013.01); *H01L 43/12* (2013.01)

(58) Field of Classification Search
CPC ..... H01L 27/222; H01L 27/228; H01L 43/02; H01L 43/08; H01L 43/10; H01L 43/12; G11C 11/161

See application file for complete search history.

(56) References Cited

U.S. PATENT DOCUMENTS

| | | | |
|---|---|---|---|
| 8,590,139 B2 | 11/2013 | Op De Beeck et al. | |
| 2016/0141490 A1* | 5/2016 | Jung | H01L 43/08 257/421 |
| 2016/0149120 A1* | 5/2016 | Park | H01L 43/08 711/126 |

FOREIGN PATENT DOCUMENTS

| | | |
|---|---|---|
| JP | 2012199391 A | 10/2012 |
| JP | 2013041961 A | 2/2013 |

* cited by examiner

*Primary Examiner* — Stephen W Smoot
(74) *Attorney, Agent, or Firm* — Holtz, Holtz & Volek PC

(57) ABSTRACT

According to one embodiment, a magnetic memory device includes a semiconductor substrate, an insulating region provided on the semiconductor substrate, an electrode plug provided in the insulating region, an amorphous conductive portion provided on the electrode plug and including a part provided in the insulating region, and a stacked structure provided on the amorphous conductive portion and including a magnetic layer.

20 Claims, 8 Drawing Sheets

MAGNETIC MEMORY DEVICE AND METHOD OF MANUFACTURING THE SAME

CROSS-REFERENCE TO RELATED APPLICATIONS

This application claims the benefit of U.S. Provisional Application No. 62/212,981, filed Sep. 1, 2015, the entire contents of which are incorporated herein by reference.

FIELD

Embodiments described herein relate generally to a magnetic memory device and a manufacturing method of the same.

BACKGROUND

Magnetic memory devices (semiconductor integrated circuit devices) in which magnetoresistive effect elements and transistors are integrated on a semiconductor substrate are proposed.

The magnetoresistive effect element is formed of a stacked layer including a magnetic layer, and the pattern of the magnetoresistive effect element is difficult to form accurately.

DETAILED DESCRIPTION

In general, according to one embodiment, a magnetic memory device includes: a semiconductor substrate; an insulating region provided on the semiconductor substrate; an electrode plug provided in the insulating region; an amorphous conductive portion provided on the electrode plug and including a part provided in the insulating region; and a stacked structure provided on the amorphous conductive portion and including a magnetic layer.

Hereinafter, embodiments will be explained with reference to accompanying drawings.

First Embodiment

Figure 1:
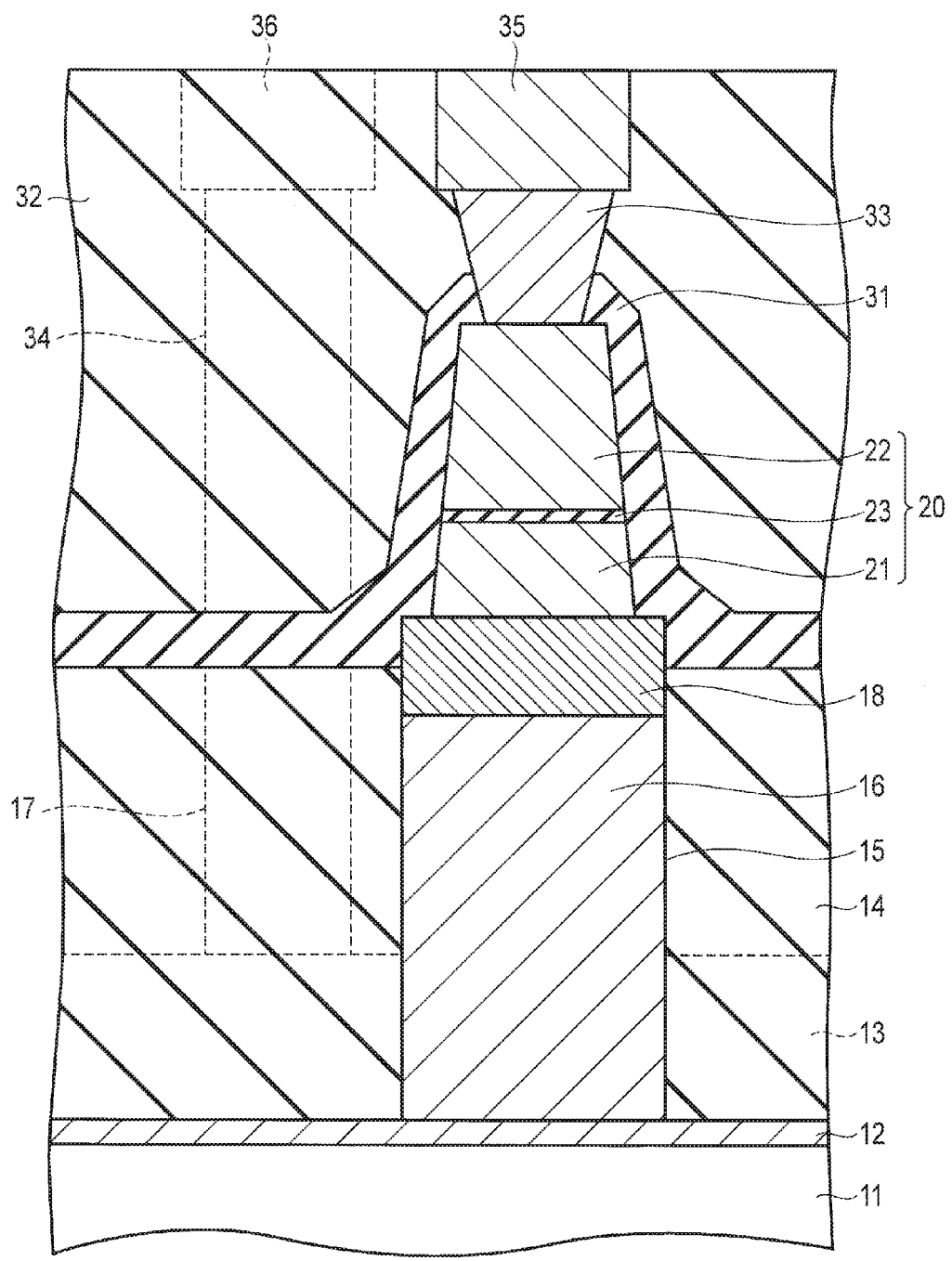
FIG. 1 is a cross-sectional view which schematically shows the structure of a magnetic memory device of first and second embodiments.

FIG. 1 is a cross-sectional view which schematically shows the structure of a magnetic memory device (semiconductor integrated circuit device) of the first embodiment.

A MOS transistor is provided with the surface area of a semiconductor substrate 11 and the MOS transistor functions as a selector transistor to select the magnetoresistive effect element. In FIG. 1, a source/drain region 12 and a gate electrode (word line) 13 are shown.

An insulating region (interlayer insulating film) 14 with a hole 15 is formed on the semiconductor substrate 11 with which the MOS transistor is provided. An electrode plugs 16 and 17 are formed within the hole 15 of the insulating region 14. The electrode plug 16 is electrically connected to one of the source/drain regions 12, and the electrode plug 17 is electrically connected to the other of the source/drain regions 12. The electrode plug 16 is used as a bottom electrode with respect to the magnetoresistive effect element.

An amorphous conductive portion 18 is formed on the electrode plug 16. The amorphous conductive portion 18 is partly formed inside the hole 15. As described later, the amorphous conductive portion 18 is formed inside a recess which is formed by removing the upper part of the electrode plug 16 formed in the hole 15. Therefore, at least the lower part of the side surface of the amorphous conductive portion 18 aligns with the side surface of the electrode plug 16. In the present embodiment, the entire side surface of the amorphous conductive portion 18 aligns with the side surface of the electrode plug 16. For the same reason, the bottom surface of the amorphous conductive portion 18 corresponds to the upper surface of the electrode plug 16. That is, the bottom surface of the amorphous conductive portion 18 and the upper surface of the electrode plug 16 are formed in the same shape, with the same area, and on the same position.

In the present embodiment, the amorphous conductive portion 18 functions as a buffer layer between the electrode plug 16 and a stacked structure 20 which is described later, and the amorphous conductive portion 18 has an amorphous structure as a whole. With the amorphous conductive portion 18 interposed between the electrode plug 16 and the stacked structure 20, the performance of the magnetoresistive effect element can be improved. The amorphous conductive portion 18 is formed of an amorphous metal mentioned below.

An amorphous metal for the amorphous conductive portion 18 may be an amorphous alloy of a transition metal element and a semimetal element. In that case, the transition metal may be hafnium (Hf), iron (Fe), palladium (Pd), molybdenum (Mo), zirconium (Zr), or tantalum (Ta). The semimetal may be boron (B), phosphorus (P), carbon (C), silicon (Si), or germanium. (Ge). For example, the amorphous alloy may contain 80 atom % of a transition metal and 20 atom % of a semimetal. As a representative amorphous alloy, HfB or FeB can be cited.

Furthermore, an amorphous metal for the amorphous conductive portion 18 may be an amorphous alloy of a plurality of transition metal elements. In that case, the amorphous alloy may be Cu—Zr alloy, Fe—Zr alloy, Ni—Nb alloy, or Ti—Ni alloy, for example.

The stacked structure 20 including a magnetic layer is formed on the amorphous conductive portion 18. In the present embodiment, the stacked structure 20 functions as a spin transfer torque (STT) magnetoresistive effect element. The stacked structure (magnetoresistive effect element) 20 includes a first magnetic layer (storage layer) 21 having a variable magnetization direction, a second magnetic layer (reference layer) 22 having a fixed magnetization direction, and a nonmagnetic layer (tunnel barrier layer) 23 interposed between the first magnetic layer 21 and the second magnetic layer 22. The stacked structure (magnetoresistive effect element) 20 is electrically connected to the electrode plug 16 with the amorphous conductive portion 18 interposed therebetween. Furthermore, the pattern of the stacked structure 20 is positioned inside the pattern of the amorphous conductive portion 18 as viewed from the direction parallel to the stacked direction of the stacked structure 20. Therefore, an area of the stacked structure 20 is less than an area of the amorphous conductive portion 18. Note that the magnetoresistive effect element may be referred to as a magnetic tunnel junction (MTJ) element.

A storage layer 21 and a reference layer 22 are a ferromagnetic layer having perpendicular magnetization. If a magnetization direction of the storage layer 21 and a magnetization direction of the reference layer 22 are parallel, the magnetoresistive effect element 20 indicates a low-resistance state. If a magnetization direction of the storage layer 21 and a magnetization direction of the reference layer 22 are anti-parallel, the magnetoresistive effect element 20 indicates a high-resistance state. Therefore, the magnetoresistive effect element 20 can store a binary value (0 or 1) depending on its resistance state (low or high). The resistance state (low or high) can be set depending on a write current direction flowing in the magnetoresistive effect element 20.

The stacked structure (magnetoresistive effect element) 20 is covered with a protective insulating film 31. A position of an interface of the protective insulating layer 31 and the insulating region 14 is higher than a position of the bottom surface of the amorphous conductive portion 18 and is lower than a position of the upper surface of the amorphous conductive portion 18. An interlayer insulating film 32 is formed on the protective insulating film 31. Via plugs 33 and 34 are formed inside the interlayer insulating film 32. One end of via plug 33 is connected to the stacked structure (magnetoresistive effect element) 20 and the other end of via plug 33 is connected to a bit line 35. On end of via plug 34 is connected to the electrode plug 17 and the other end of via plug 34 is connected to a source line 36.

Now, a manufacturing method of the magnetic memory device (semiconductor integrated circuit device) of the present embodiment will be explained.

FIGS. 2 to 7 are cross-sectional views which schematically show a manufacturing method of the magnetic memory device of the present embodiment. Note that, although the semiconductor substrate, transistor, and the like are omitted in FIGS. 2 to 7; they are actually formed in the structure of FIGS. 2 to 7 as in FIG. 1.

Figure 2:
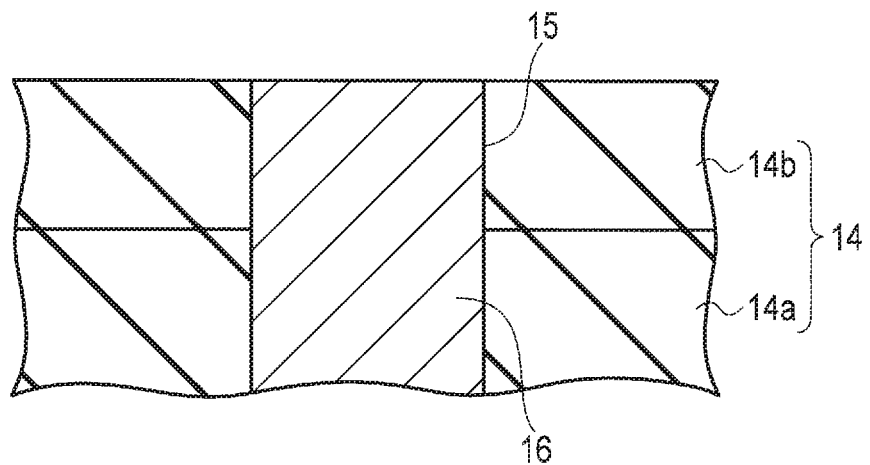
FIG. 2 is a cross-sectional view which schematically shows a part of a manufacturing method of the magnetic memory device of the first and second embodiments.

Initially, as shown in FIG. 2, a structure including an insulating region (interlayer insulating film) 14 and an electrode plug 16 in the insulating region 14 is formed on a semiconductor substrate (not shown) with a transistor (not shown). In the present embodiment, the insulating region 14 is composed of a silicon oxide film 14a and a silicon nitride film 14b. The structure in FIG. 2 is obtained by forming a hole 15 in the insulating region 14 and forming the electrode plug 16 in the hole 15. The electrode plug 16 may be tungsten (W) or titanium nitride (TiN). Additionally, tantalum (Ta) may be formed on tungsten (W) or titanium nitride (TiN).

Figure 3:
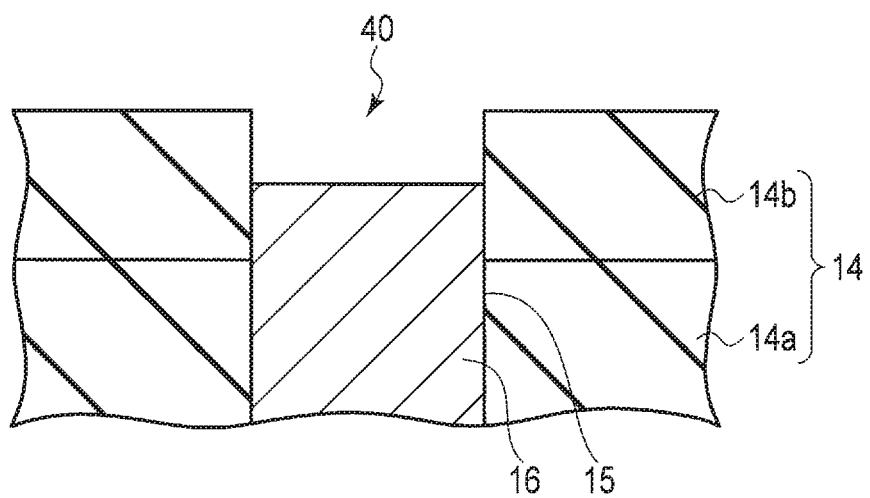
FIG. 3 is another cross-sectional view which schematically shows a part of a manufacturing method of the magnetic memory device of the first and second embodiments.

Then, as shown in FIG. 3, the upper part of the electrode plug 16 is removed by etching back to form a recess 40. That is, the upper part of the electrode plug 16 is removed to expose the upper part of the hole 15, and the recess 40 is formed.

Figure 4:
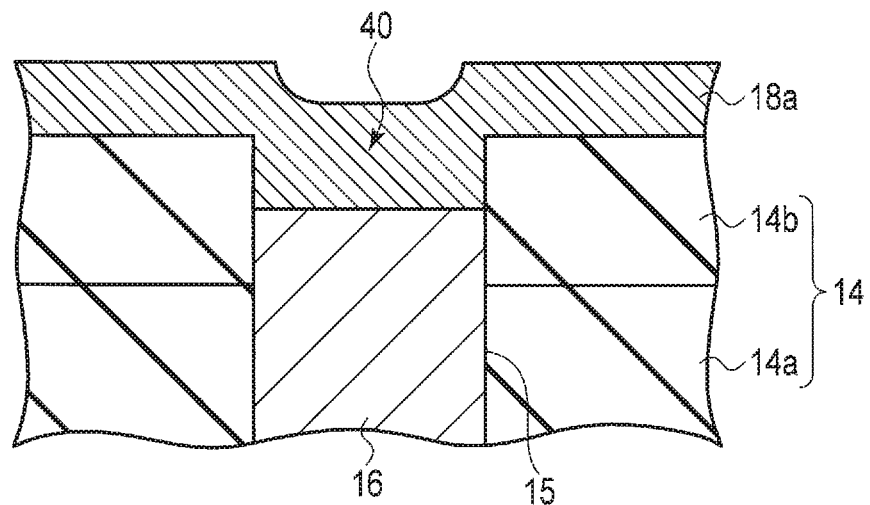
FIG. 4 is another cross-sectional view which schematically shows a part of a manufacturing method of the magnetic memory device of the first and second embodiments.

Then, as shown in FIG. 4, an amorphous conductive layer 18a is formed on the insulating region 14 and in the recess 40 by sputtering.

Figure 5:
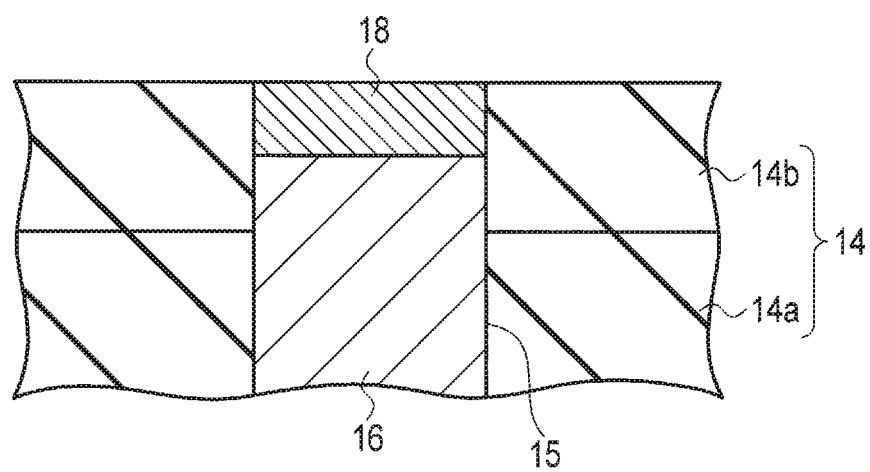
FIG. 5 is another cross-sectional view which schematically shows a part of a manufacturing method of the magnetic memory device of the first and second embodiments.

Then, as shown in FIG. 5, the part of the amorphous conductive layer 18a formed on the insulating region 14 is removed by ion beam etching (IBE). Specifically, an irradiation angle of the ion beam is set such that an angle defined by the ion beam and the upper surface of the amorphous conductive layer 18a becomes approximately 20 degrees. As a result, the amorphous conductive portion 18 can be formed selectively in the recess 40. Note that the amorphous conductive portion 18 may be formed by chemical mechanical polishing (CMP) instead of IBE.

Figure 6:
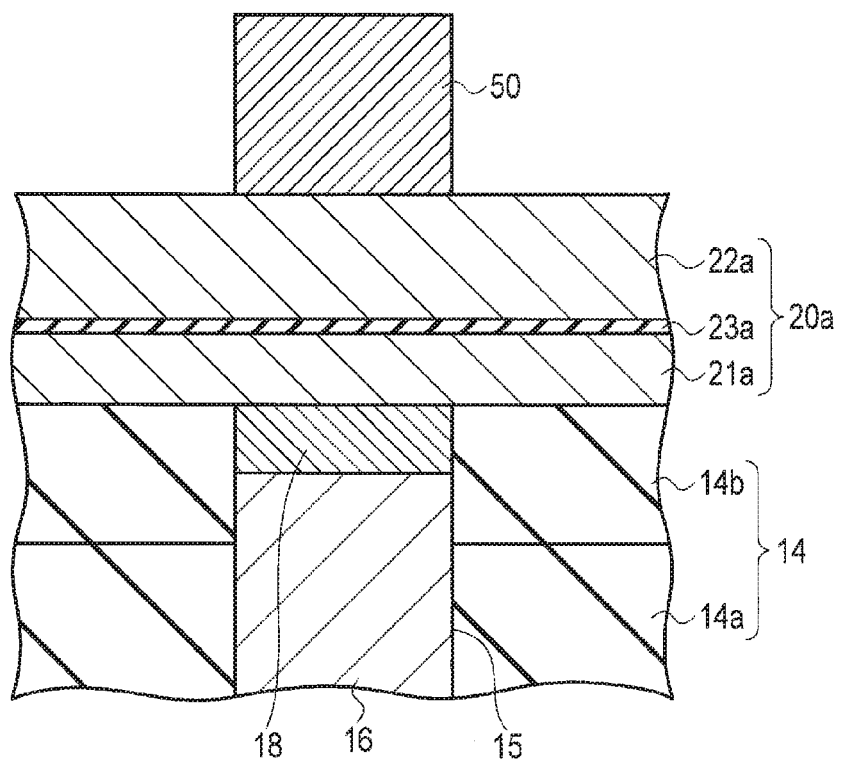
FIG. 6 is another cross-sectional view which schematically shows a part of a manufacturing method of the magnetic memory device of the first and second embodiments.

Then, as shown in FIG. 6, a stacked film 20a including a magnetic layer is formed on the insulating region 14 and the amorphous conductive portion 18. Specifically, the stacked film 20a includes a first magnetic layer (storage layer) 21a, second magnetic layer (reference layer) 22a, and a nonmagnetic layer (tunnel barrier layer) 23a interposed between the first magnetic layer 21a and the second magnetic layer 22a. Furthermore, a hard mask 50 is formed on the stacked film 20a.

Figure 7:
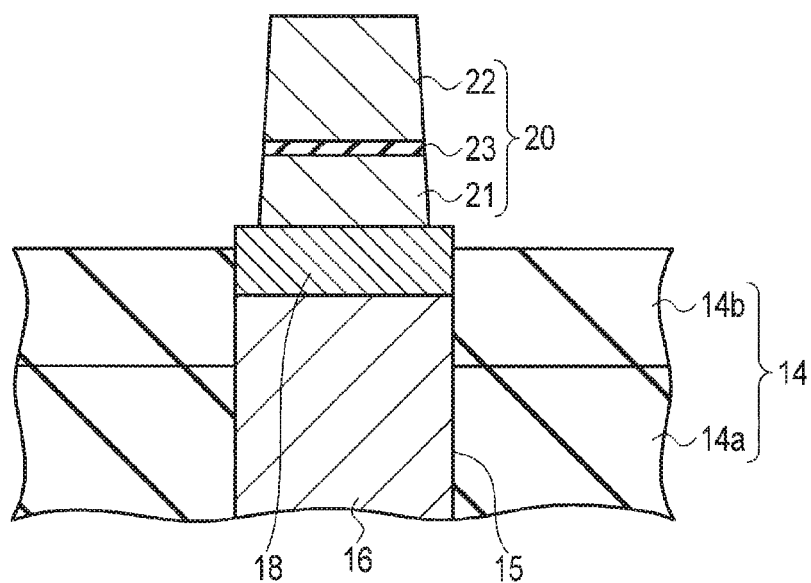
FIG. 7 is another cross-sectional view which schematically shows a part of a manufacturing method of the magnetic memory device of the first and second embodiments.

Then, as shown in FIG. 7, the stacked film 20a is etched to form a stacked structure 20. Specifically, the stacked film 20a is etched through IBE using the hard mask 50 as a mask, and the stacked structure including the magnetic layer is formed on the amorphous conductive portion 18. During the etching process, the hard mask 50 shrinks and thus, an area of the pattern of the stacked structure 20 becomes smaller than that of the amorphous conductive portion 18. In this etching process, the insulating region 14 is partly etched, and the upper part of the insulating region 14 recedes. As a result, a position of the upper surface of the insulating region 14 becomes higher than a position of the bottom surface of the amorphous conductive portion 18 and lower than a position of the upper surface of the amorphous conductive portion 18. Furthermore, the hard mask 50 is removed, and the structure of FIG. 7 is obtained.

After the process of FIG. 7, a protective insulating film 31 covering the stacked structure 20 is formed as shown in FIG. 1. The protective, insulating film 31 may be a silicon nitride film or an aluminum oxide film. Furthermore, an insulating film 32 covering the protective insulating film 31 is formed. Then, a via plug 33, via plug 34, bit line 35, source line 36, and the like are formed to obtained the structure shown in FIG. 1.

As explained above, in the present embodiment, the pattern of the amorphous conductive portion 18 is already formed in the hole 15 in the insulating region 14 before the stacked structure 20 is formed in the processes shown in FIGS. 6 and 7. Therefore, only the stacked film 20a should be patterned when the stacked structure 20 is formed and patterning of the amorphous conductive layer is not required. If the patterning of the amorphous conductive layer is required when the stacked structure 20 is formed, the following problems may occur.

Firstly, the total thickness of a patterned film becomes larger, the stacked structure having a suitable shape becomes difficult to form. That is, if the total thickness of the film to be etched becomes larger when performing the etching using a hard mask as a mask, the shrinkage of the hard mask becomes greater, and the hard mask does not function suitably until the end of the etching. As a result, the stacked structure having a suitable shape becomes difficult to form.

Secondly, if the amorphous conductive layer is etched, an etching residue is produced and it may cause a leak between the stacked structure and its adjacent stacked structure (magnetoresistive effect element).

Thirdly, if the amorphous conductive layer is etched, an etching product is produced and re-deposition of the etching product may cause a short-circuit at a side surface of the stacked structure (magnetoresistive effect element).

In the present embodiment, since the pattern of amorphous conductive portion 18 is formed before the stacked structure 20 is formed, the above problems can be averted. The pattern of the stacked structure 20 can be made accurately, and the magnetoresistive effect element with excellent performance and credibility can be achieved.

Furthermore, the amorphous layer does not have a crystalline structure, and the hole and recess can be filled easily and securely. Therefore, in the present embodiment, the amorphous conductive portion 18 can be formed easily and securely inside the recess 40.

Note that, in the embodiment described above, the structure of the stacked structure 20 can be changed arbitrarily. For example, a cap layer may be formed on the second magnetic layer (reference layer) 22. Furthermore, the positional relationship between the first magnetic layer (storage layer) 21 and the second magnetic layer (reference layer) 22 may be reversed such that the first magnetic layer (storage layer) 21 is positioned at the upper layer side and the second magnetic layer (reference layer) 22 is positioned at the lower layer side. Furthermore, a shift canceling layer may be provided as a third magnetic layer. Furthermore, of the two main surfaces of the second magnetic layer (reference layer) 22, one which does not contact the nonmagnetic layer (tunnel barrier layer) 23 may contact the antiferromagnetic layer. Furthermore, the second magnetic layer (reference layer) 22 may include a first ferromagnetic layer, ruthenium (Ru) layer, and second ferromagnetic layer. Furthermore, the stacked structure 20 may include a first reference layer, first tunnel barrier layer, storage layer, second tunnel barrier layer, and second reference layer.

Second Embodiment

Now, a second embodiment will be explained. Note that the structure (cf. FIG. 1) and the manufacturing method (cf. FIGS. 2 to 7) of the second embodiment are basically the same as that of the first embodiment. Therefore, the matters described in the section of the first embodiment will be omitted.

In the present embodiment, the amorphous conductive portion 18 is formed of a magnetic material (amorphous metal magnetic material). Specifically, the magnetic material for the amorphous conductive portion 18 may be, for example, CoPt, CoPd, NiPt, FePt, or FePd. The amorphous conductive portion 18 formed of such a magnetic material functions as a shift canceling layer of the magnetoresistive effect element. That is, the amorphous conductive portion 18 functioning as a shift canceling layer applies a magnetic field to a first magnetic layer (storage layer) 21, the magnetic field whose direction is opposite to a magnetic field applied from a second magnetic layer (reference layer) 22 to the first magnetic layer (storage layer) 21. Therefore, the magnetic field applied from the second magnetic layer (reference layer) 22 to the first magnetic layer (storage layer) 21 can be canceled by the amorphous conductive portion 18.

In the present embodiment, as in the first embodiment, an amorphous conductive portion 18 is already formed in the hole 15 in the insulating region 14 before a stacked structure 20 is formed in the processes of FIGS. 6 and 7. Therefore, only the stacked film 20a should be patterned when forming the pattern of the stacked structure 20, and patterning of an amorphous conductive layer is not required. Therefore, the same advantages as in the first embodiment can be achieved by the present embodiment.

Third Embodiment

Now, a third embodiment will be explained. Note that the structure and the manufacturing method of the third embodiment are basically the same as that of the first and second embodiments. Therefore, the matters described in the section of the first and second embodiments will be omitted.

In the present embodiment, an amorphous conductive portion 18 includes a plural kind of amorphous conductive layers. Specifically, the amorphous conductive portion 18 is structured such that an amorphous conductive portion (buffer layer) described in the first embodiment and an amorphous conductive portion (magnetic layer) described in the second embodiment are stacked therein.

FIGS. 8 to 15 are cross-sectional views which schematically show a manufacturing method of a magnetic memory device of the present embodiment. Note that, although the semiconductor substrate, transistor, and the like are omitted in FIGS. 8 to 15; they are actually formed in the structure of FIGS. 8 to 15 as in FIG. 1.

Figure 8:
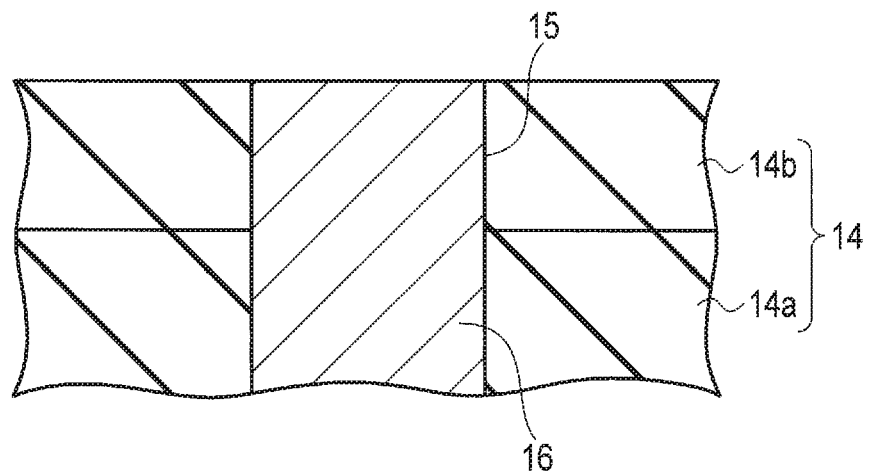
FIG. 8 is a cross-sectional view which schematically shows a manufacturing method of a magnetic memory device of a third embodiment.

Initially, as shown in FIG. 8, a structure including an insulating region (interlayer insulating film) 14 and an electrode plug 16 in the insulating region 14 is formed on a semiconductor substrate (not shown) with a transistor (not shown). This is performed as in the process of FIG. 2 in the first embodiment.

Figure 9:
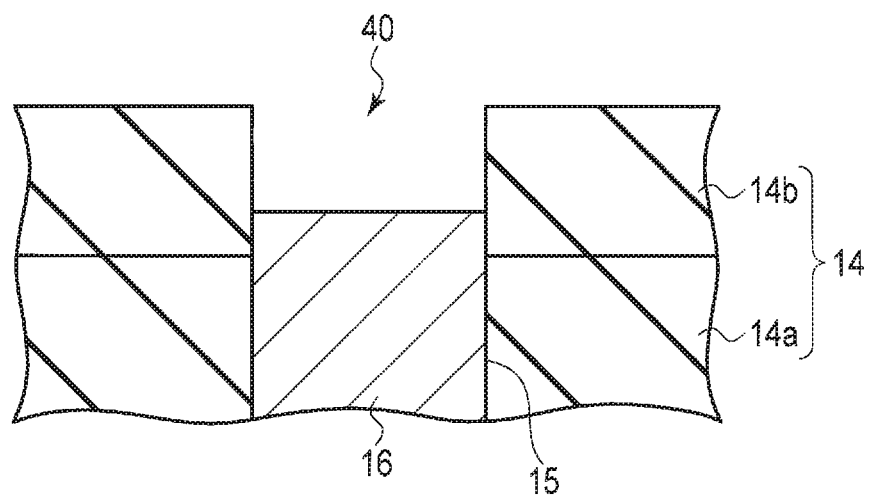
FIG. 9 is another cross-sectional view which schematically shows a manufacturing method of a magnetic memory device of the third embodiment.

Then, as in FIG. 9, the upper part of the electrode plug 16 is removed by etching back to form a recess 40 as in the process of FIG. 3 in the first embodiment.

Figure 10:
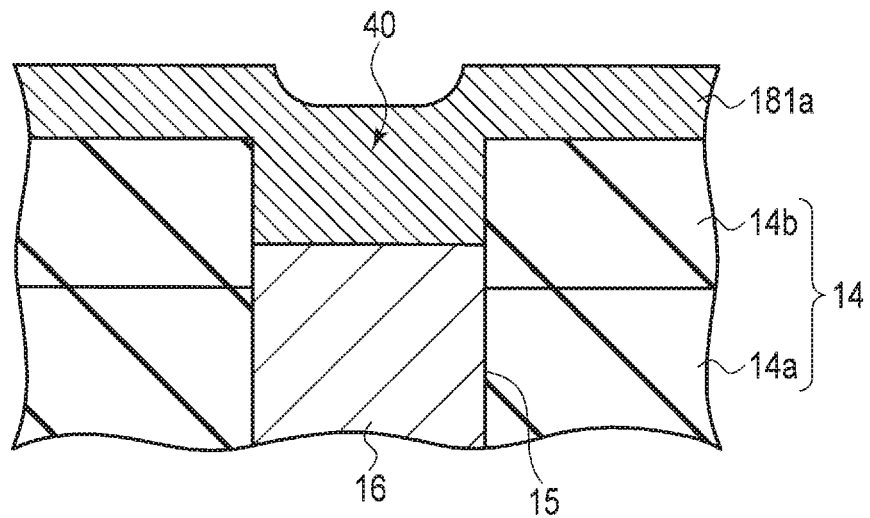
FIG. 10 is another cross-sectional view which schematically shows a manufacturing method of a magnetic memory device of the third embodiment.

Then, as shown in FIG. 10, a first amorphous conductive layer 181a is formed on the insulating region 14 and in the recess 40 by sputtering. The first amorphous conductive layer 181a is formed of a magnetic material (amorphous metal magnetic material) as in the second embodiment. That is, the first amorphous conductive layer 181a is formed of a magnetic material for a shift canceling layer.

Figure 11:
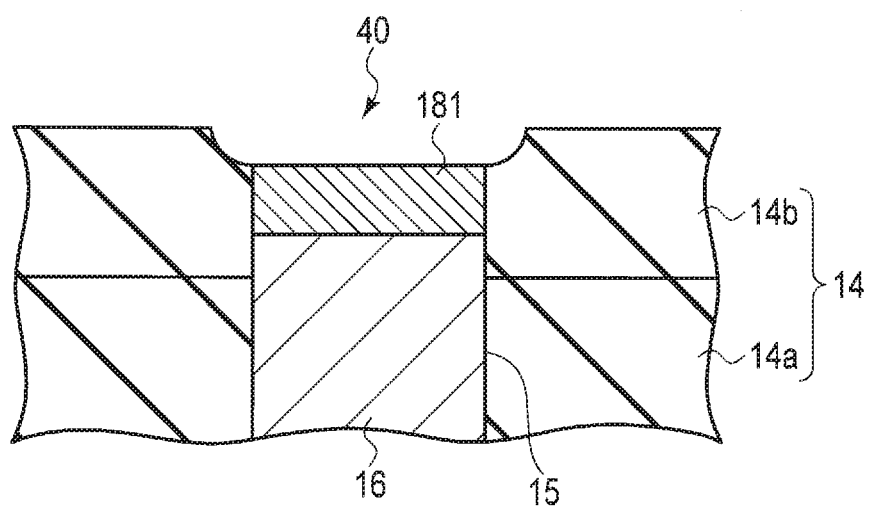
FIG. 11 is another cross-sectional view which schematically shows a manufacturing method of a magnetic memory device of the third embodiment.

Then, as shown in FIG. 11, the part of the first amorphous conductive layer 181a formed on the insulating region 14 is removed by IBE. Specifically, an ion beam is irradiated in a direction vertical to the upper surface of the first amorphous conductive layer 181a. In this IBE process, the upper part of the first amorphous conductive layer 181a formed in the recess 40 is removed. As a result, a first amorphous conductive portion 181 is formed in the recess 40.

Figure 12:
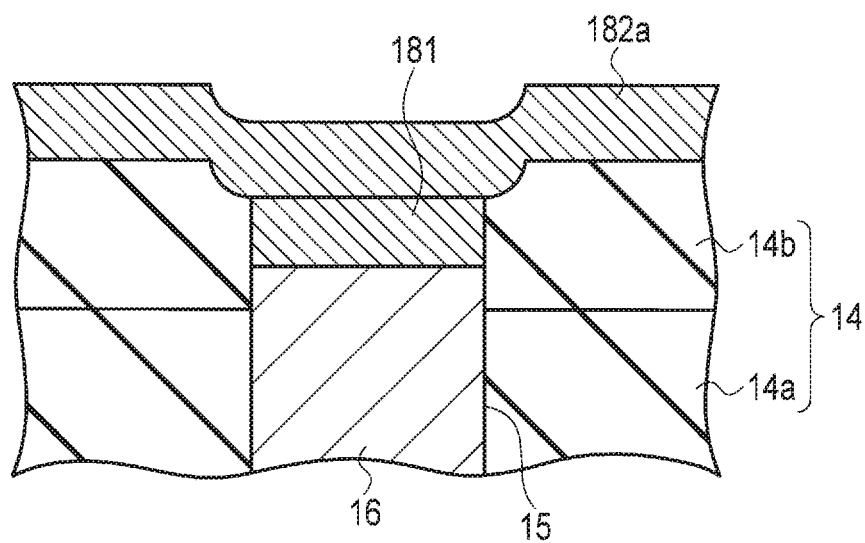
FIG. 12 is another cross-sectional view which schematically shows a manufacturing method of a magnetic memory device of the third embodiment.

Then, as shown in FIG. 12, a second amorphous conductive layer 182a is formed on the insulating region 14 and on the first amorphous conductive portion 181 in the recess 40 by sputtering. The second amorphous conductive layer 182a is formed of an amorphous metal material as in the first embodiment. That is, the second amorphous conductive layer 182a is formed of an amorphous alloy of a transition metal element and a semimetal element, or an amorphous alloy of a plurality of transition metal elements.

Figure 13:
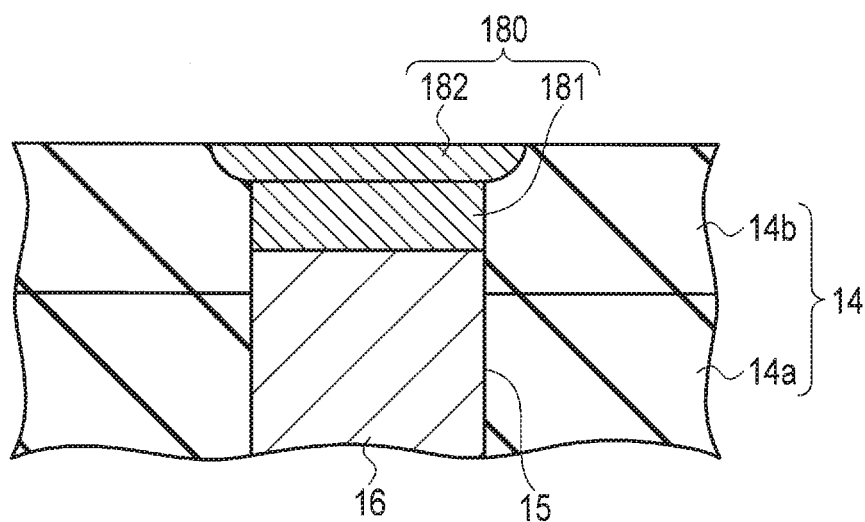
FIG. 13 is another cross-sectional view which schematically shows a manufacturing method of a magnetic memory device of the third embodiment.

Then, as shown in FIG. 13, the part of the second amorphous conductive layer 182a formed on the insulating region 14 is removed by IBE. Specifically, an irradiation angle of an ion beam is set such that an angle defined by the ion beam and the upper surface of the second amorphous conductive layer 182a becomes approximately 20 degrees. As a result, a second amorphous conductive portion 182 can be formed selectively in the recess 40. Note that the second amorphous conductive portion 182 may be formed by CMP instead of IBE. As above, an amorphous conductive portion 180 including a plural kind of amorphous conductive layers (the first amorphous conductive portion 181 and the second amorphous conductive portion 182) is formed in the recess 40 in the insulating region 14.

Figure 14:
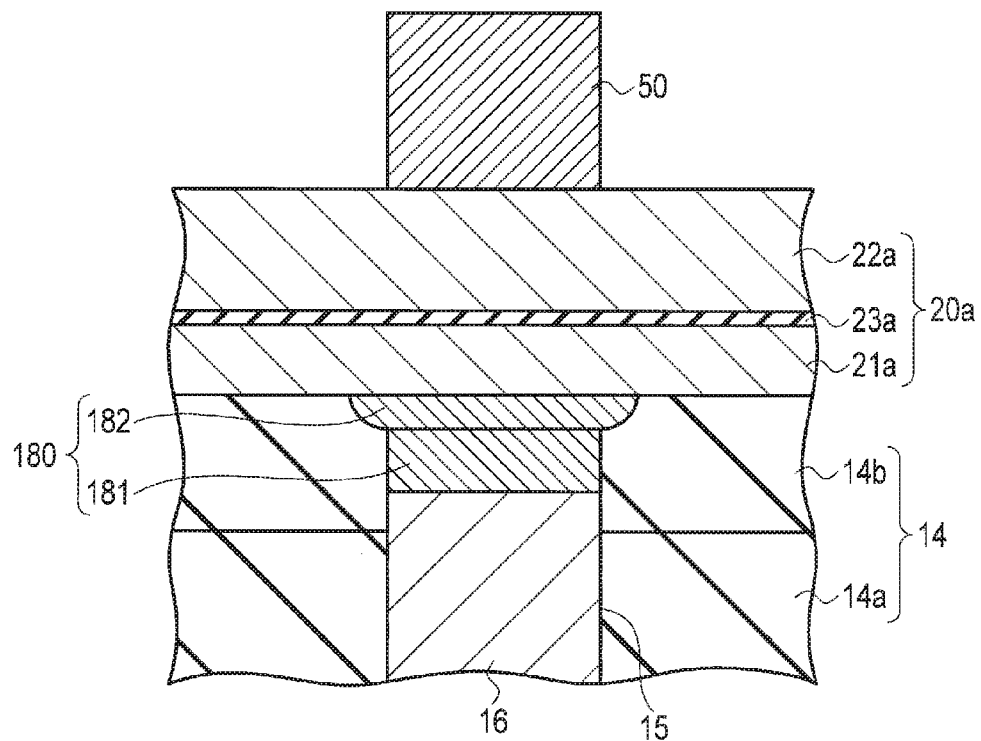
FIG. 14 is another cross-sectional view which schematically shows a manufacturing method of a magnetic memory device of the third embodiment.

Then, as shown in FIG. 14, a stacked film 20a including a magnetic layer is formed on the insulating region 14 and the amorphous conductive portion 180. The stacked film 20a includes, as in the first embodiment, a first magnetic layer (storage layer) 21a, second magnetic layer (reference layer) 22a, and a nonmagnetic layer (tunnel barrier layer) 23a interposed between the first magnetic layer 21a and the second magnetic layer 22a. Furthermore, a hard mask 50 is formed on the stacked film 20a.

Figure 15:
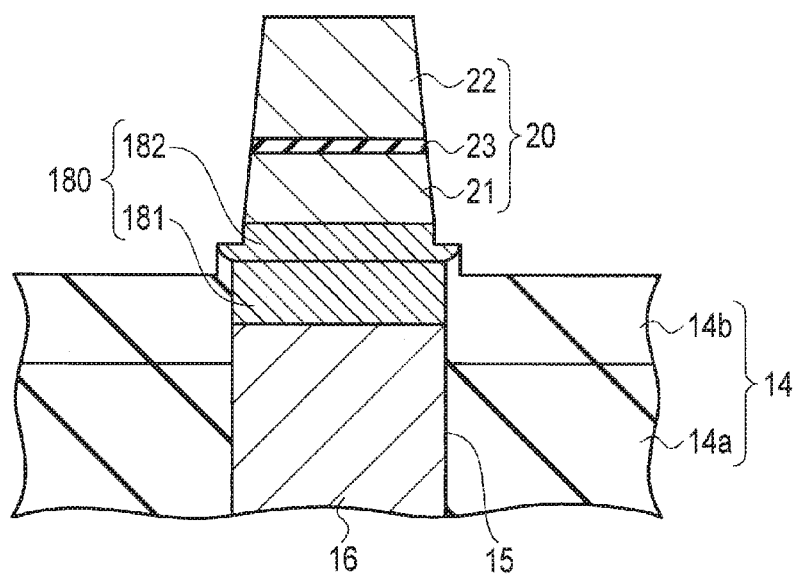
FIG. 15 is another cross-sectional view which schematically shows a manufacturing method of a magnetic memory device of the third embodiment.

Then, as shown in FIG. 15, a stacked structure 20 is formed by etching the stacked film 20a as in the first embodiment. That is, the stacked structure 20 including a magnetic layer is formed on the amorphous conductive portion 180 by etching the stacked film 20a through IBE using the hard mask 50 as a mask. Furthermore, the hard mask 50 is removed and the structure shown in FIG. 15 is obtained.

Processes after that are the same as in the first embodiment, and a protective insulating film 31, interlayer insulating film 32, via plug 33, via plug 34, bit line 35, source line 36, and the like are formed as shown in FIG. 1.

In the present embodiment, as in the first and second embodiments, the amorphous conductive portion 180 is already formed in the hole 15 in the insulating region 14 before a stacked structure 20 is formed in the processes of FIGS. 14 and 15. Therefore, only the stacked film 20a should be patterned when forming the pattern of the stacked structure 20, and patterning of an amorphous conductive layer is not required. Therefore, the same advantages as in the first and second embodiments can be achieved by the present embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
    a semiconductor substrate;
    an insulating region provided on the semiconductor substrate;
    an electrode plug provided in the insulating region;
    an amorphous conductive portion provided on the electrode plug and including a part provided in the insulating region; and
    a stacked structure provided on the amorphous conductive portion and including a magnetic layer,
    wherein the amorphous conductive portion is formed of an amorphous alloy of a plurality of transition metal elements.

2. The device of claim 1, wherein at least a lower part of a side surface of the amorphous conductive portion aligns with a side surface of the electrode plug.

3. The device of claim 1, wherein a bottom surface of the amorphous conductive portion corresponds to an upper surface of the electrode plug.

4. The device of claim 1, wherein the stacked structure includes a first magnetic layer having a variable magnetization direction, a second magnetic layer having a fixed magnetization direction, and a nonmagnetic layer provided between the first magnetic layer and the second magnetic layer.

5. The device of claim 1, wherein a pattern of the stacked structure is positioned inside a pattern of the amorphous conductive portion when viewed from a direction parallel to a stacked direction of the stacked structure.

6. The device of claim 1, wherein the electrode plug is electrically connected to one of a source region or a drain region of a transistor provided in a surface region of the semiconductor substrate.

7. The device of claim 1, wherein the stacked structure is covered with an insulating film different from an insulating film in which the electrode plug is provided.

8. A magnetic memory device comprising:
    a semiconductor substrate;
    an insulating region provided on the semiconductor substrate;
    an electrode plug provided in the insulating region;
    an amorphous conductive portion provided on the electrode plug and including a part provided in the insulating region; and
    a stacked structure provided on the amorphous conductive portion and including a magnetic layer,
    wherein the amorphous conductive portion is formed of a magnetic material.

9. The device of claim 8, wherein at least a lower part of a side surface of the amorphous conductive portion aligns with a side surface of the electrode plug.

10. The device of claim 8, wherein a bottom surface of the amorphous conductive portion corresponds to an upper surface of the electrode plug.

11. The device of claim 8, wherein the stacked structure includes a first magnetic layer having a variable magnetization direction, a second magnetic layer having a fixed magnetization direction, and a nonmagnetic layer provided between the first magnetic layer and the second magnetic layer.

12. The device of claim 11, wherein the amorphous conductive portion applies a magnetic field to the first magnetic layer, a direction of the magnetic field being opposite to a direction of a magnetic field applied from the second magnetic layer to the first magnetic layer.

13. The device of claim 8, wherein a pattern of the stacked structure is positioned inside a pattern of the amorphous conductive portion when viewed from a direction parallel to a stacked direction of the stacked structure.

14. The device of claim 8, wherein the electrode plug is electrically connected to one of a source region or a drain region of a transistor provided in a surface region of the semiconductor substrate.

15. A magnetic memory device comprising:
a semiconductor substrate;
an insulating region provided on the semiconductor substrate;
an electrode plug provided in the insulating region;
an amorphous conductive portion provided on the electrode plug and including a part provided in the insulating region; and
a stacked structure provided on the amorphous conductive portion and including a magnetic layer,
wherein the amorphous conductive portion includes plural kinds of amorphous conductive layers.

16. The device of claim 15, wherein at least a lower part of a side surface of the amorphous conductive portion aligns with a side surface of the electrode plug.

17. The device of claim 15, wherein a bottom surface of the amorphous conductive portion corresponds to an upper surface of the electrode plug.

18. The device of claim 15, wherein the stacked structure includes a first magnetic layer having a variable magnetization direction, a second magnetic layer having a fixed magnetization direction, and a nonmagnetic layer provided between the first magnetic layer and the second magnetic layer.

19. The device of claim 15, wherein a pattern of the stacked structure is positioned inside a pattern of the amorphous conductive portion when viewed from a direction parallel to a stacked direction of the stacked structure.

20. The device of claim 15, wherein the electrode plug is electrically connected to one of a source region or a drain region of a transistor provided in a surface region of the semiconductor substrate.

* * * * *